United States Patent
Cha et al.

(10) Patent No.: US 9,013,950 B2
(45) Date of Patent: Apr. 21, 2015

(54) COLUMN SELECT SIGNAL GENERATION CIRCUIT

(75) Inventors: Jin Youp Cha, Icheon-si (KR); Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 230 days.

(21) Appl. No.: 13/586,155

(22) Filed: Aug. 15, 2012

(65) Prior Publication Data
US 2013/0315023 A1    Nov. 28, 2013

(30) Foreign Application Priority Data
May 25, 2012    (KR) .................. 10-2012-0056116

(51) Int. Cl.
| | |
|---|---|
| *G11C 8/00* | (2006.01) |
| *G11C 8/18* | (2006.01) |
| *G11C 7/10* | (2006.01) |
| *G11C 7/12* | (2006.01) |
| *G11C 8/10* | (2006.01) |

(52) U.S. Cl.
CPC ... *G11C 7/12* (2013.01); *G11C 8/10* (2013.01)

(58) Field of Classification Search
CPC ............ G11C 8/12; G11C 7/12; G11C 16/08; G11C 16/24; G11C 29/26; G11C 7/1027; G11C 13/0026

USPC .............. 365/230.06, 230.03, 230.08, 230.14
See application file for complete search history.

(56) References Cited

U.S. PATENT DOCUMENTS

| | | | | |
|---|---|---|---|---|
| 5,717,650 A | * | 2/1998 | Chung et al. ............. | 365/230.06 |
| 5,930,196 A | * | 7/1999 | Yim ......................... | 365/230.06 |
| 6,055,207 A | * | 4/2000 | Nam ......................... | 365/233.14 |
| 6,064,622 A | * | 5/2000 | Lee et al. .................. | 365/230.06 |

FOREIGN PATENT DOCUMENTS

| | | |
|---|---|---|
| KR | 100311041 B1 | 9/2001 |
| KR | 100801059 B1 | 1/2008 |

* cited by examiner

*Primary Examiner* — J. H. Hur
*Assistant Examiner* — Ajay Ojha
(74) *Attorney, Agent, or Firm* — William Park & Associates Patent Ltd.

(57) ABSTRACT

A column select signal generation circuit includes: a first current controller configured to control the level of a pre-column select signal in response to a bank active signal, a driver configured to generate an amplified column select signal in response to the pre-column select signal, and a second current controller configured to generate an output signal of the driver as a column select signal in response to the bank active signal.

8 Claims, 3 Drawing Sheets

… (1)

COLUMN SELECT SIGNAL GENERATION CIRCUIT

CROSS-REFERENCES TO RELATED APPLICATION

The present application claims priority under 35 U.S.C. §119(a) to Korean application number 10-2012-0056116, filed on May 25, 2012, in the Korean Intellectual Property Office, which is incorporated herein by reference in its entirety.

BACKGROUND

1. Technical Field

The present invention relates to a semiconductor apparatus, and more particularly, to a column select signal generation circuit.

2. Related Art

In general, a semiconductor memory apparatus selects a word line and a bit line according to an outside address input, and accesses a memory cell connected between the selected word line and bit line to perform a read or write operation.

FIG. 1 is a configuration diagram of a conventional semiconductor memory apparatus.

Referring to FIG. 1, the conventional semiconductor memory apparatus 10 includes a control logic 100, a memory cell array 101, a row address buffer 103, a row decoder 105, a word line driver 107, a column address buffer 109, a column decoder 111, and a sense amplifier/write driver block (SA/WD) 113.

In order to access a specific memory cell, the row decoder 105 decodes a row address based on an outside input and generates a word line driving signal, and the column decoder 111 decodes a column address ADD_C and generates a column select signal YI.

FIG. 2 is a configuration diagram of the conventional column decoder.

The column decoder 20 includes a decoding unit 22 and a column select signal generation unit 24. The decoding unit 22 is configured to output pre-decoded signals LAY345<0:7>, LAY67<0:3>, and LAY89<0:3> in response to a strobe signal STRB and a column address latch signal AYT<3:9> obtained by latching the column address ADD_C. The column select signal generation unit 24 is configured to combine the output signals of the decoding unit 22 to output the column select signal YI.

The decoding unit 22 may include a first decoder 201, a fourth decoder 207, a second decoder 203, and a third decoder 205. The first decoder 201 is configured to decode a first column address latch signal AYT<3:5>. The fourth decoder 207 is configured to generate the first pre-decoded signal LAY345<0:7> in response to an output signal of the first decoder 201 and the strobe signal STRB. The second decoder 203 is configured to generate the second pre-decoded signal LAY67<0:3> by decoding a second column address latch signal AYT<6:7>. Similarly, the third decoder 205 is configured to generate the third pre-decoded signal LAY89<0:3> by decoding a third column address latch signal AYT<8:9>.

The column select signal generation unit 24 includes a first driver 209, a current controller 211, and a second driver 213. The first driver 209 is driven in response to the first pre-decoded signal LAY345<0:7> and connected to a power supply voltage terminal VDD. The current controller 211 is connected to the first driver 209, and configured to control the voltage of the first driver 209 according to a combination of the second and third pre-decoded signals LAY67<0:3> and LAY89<0:3>. The second driver 213 is connected to an output terminal of the first driver 209 and configured to output the column select signal YI.

FIG. 2 illustrates an example in which the column decoder 20 generates 128 (8*4*4) column select signals YI using the column address latch signal AYT<3:9>.

Since the column select signal YI outputted from the second driver 213 must drive a very long metal line, transistors P2 and N2 forming the second driver 213 are designed to have a large size.

However, when the column select signal YI is outputted as a low level, the switching element P2 of the second driver 213 is turned off, and the switching element N2 is turned on. Therefore, a leakage current inevitably flows into a ground terminal through the switching element N2. Furthermore, since several thousands of second drivers 213 may exist depending on the capacity of the memory apparatus, the leakage current in an off state occupies a considerable portion of the entire operation current of the memory apparatus.

SUMMARY

In an embodiment of the present invention, a column select signal generation circuit includes: a first current controller configured to control the level of a pre-column select signal in response to a bank active signal, a driver configured to generate an amplified column select signal in response to the pre-column select signal, and a second current controller configured to generate an output signal of the driver as a column select signal in response to the bank active signal.

In an embodiment of the present invention, a column select signal generation circuit includes: a first driver configured to generate a pre-column select signal in response to a column address, a second driver configured to drive the pre-column select signal and generate a column select signal, a first current controller connected between the first and second drivers and configured to control a current of the second driver in response to a bank active signal, and a second current controller connected to an output terminal of the second driver and configured to control a current of a column select signal output terminal in response to the bank active signal.

BRIEF DESCRIPTION OF THE DRAWINGS

Features, aspects, and embodiments are described in conjunction with the attached drawings, in which.

DETAILED DESCRIPTION

Hereinafter, a column select signal generation circuit according to the present invention will be described below with reference to the accompanying drawings through various embodiments.

Figure 3:
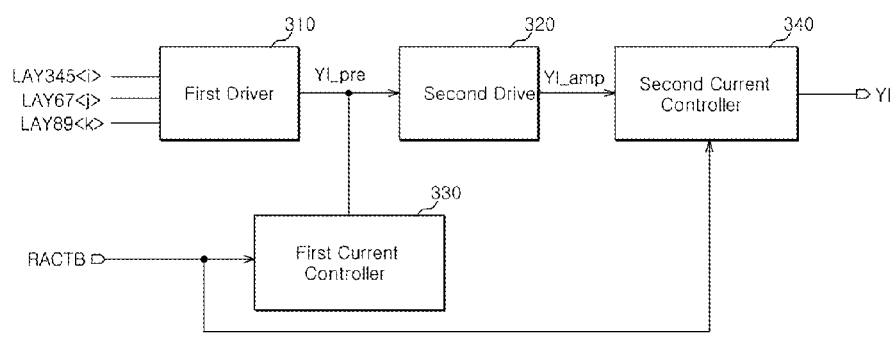
FIG. 3 is a block diagram of a column select signal generation circuit according to an embodiment of the present invention.

FIG. 3 is a configuration diagram of a column select signal generation circuit according to an embodiment of the present invention.

Referring to FIG. 3, the column select signal generation circuit 30 according to the embodiment of the present invention includes a first driver 310, a second driver 320, a first current controller 330, and a second current controller 340.

The first driver 310 is configured to generate a pre-column select signal YI_pre in response to a first pre-decoded signal LAY345<i>, a second pre-decoded signal LAY67<j>, and a third pre-decoded signal LAY89<k>.

In this embodiment of the present invention, the first to third pre-decoded signals LAY345<i>, LAY67<j>, and LAY89<k> may be generated by a decoding unit configured to perform decoding in response to a strobe signal STRB and a column address latch signal AYT<3:9> obtained by latching a column address ADD_C. The decoding unit to generate the first to third pre-decoded signals LAY345<i>, LAY67<j>, and LAY89<k> may be configured in a similar manner as the decoding unit 22 of FIG. 2, for example, but is not limited thereto.

The second driver 320 is configured to amplify the pre-column select signal YI_pre generated by the first driver 310 and thus to generate an amplified column select signal YI_amp.

The first current controller 330 is connected between the first and second drivers 310 and 320, and configured to control a current path of the second driver 320 in response to a bank active signal RACTB.

The second current controller 340 is connected to an output terminal of the second driver 320, and configured to output a column select signal YI in response to the bank active signal RACTB.

The column select signal generation circuit 30 according to the embodiment of the present invention operates in response to the bank active signal RACTB. Thus a leakage current of the column select signal generation circuit 30 is controlled depending on whether a corresponding bank is selected or not.

For example, when a specific bank is selected, the bank active signal RACTB is set to a low level. Furthermore, the first driver 310 may generate the low-level pre-column select signal YI_pre, and the second driver 320 may generate the high-level amplified column select signal YI_amp.

In this case, the first current controller 330 blocks a current leaking from the second driver 320 to a ground terminal in response to the bank active signal RACTB, thereby preventing the level of the amplified column select signal YI_amp from decreasing. Furthermore, the second current controller 340 outputs the amplified column select signal YI_amp as the final column select signal YI. The second current controller 340 blocks a current induced at the output terminal from leaking to the ground terminal in response to the bank select signal RACTB such that the column select signal YI is stably outputted.

When a specific bank is not selected, the bank active signal RACTB is set to a high level. Furthermore, the first driver 310 may generate the high-level pre-column select signal YI_pre, and the second driver 320 may generate the low-level amplified column select signal YI_amp.

In this case, the first current controller 330 blocks a current leaking from the second driver 320 to the ground terminal in response to the bank active signal RACTB, thereby preventing the level of the amplified column select signal YI_amp from decreasing. Furthermore, the second current controller 340 outputs the amplified column select signal YI_amp as the final column select signal YI. The second current controller 340 induces only a minimum amount of current induced at the output terminal to the ground terminal in response to the bank select signal RACTB such that the low-level column select signal YI is stably outputted.

Figure 4:
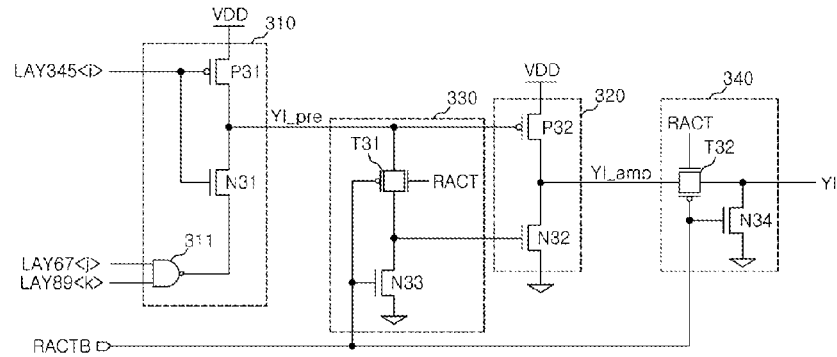
FIG. 4 is a configuration diagram of the column select signal generation circuit illustrated in FIG. 3.

FIG. 4 is a configuration diagram of the column select signal generation circuit illustrated in FIG. 3.

Referring to FIG. 4, the first driver 310 includes a first inverter unit P31 and N31 and a current control unit 311. The first inverter unit P31 and N31 is connected to the power supply voltage terminal VDD and configured to drive the first pre-decoded signal LAY345<i> to output as the pre-column select signal YI_pre. The current control unit 311 is connected in series to the first inverter unit P31 and N31 and configured to control the voltage of the first inverter unit P31 and N31 according to a combination of the second and third pre-decoded signals LAY67<j> and LAY89<k>. Here, the first inverter unit P31 and N31 may include a first switching element P31 and a second switching element N31. The first switching element P31 is connected to the power supply voltage terminal VDD and driven by the first pre-decoded signal LAY345<i>, and the second switching element N31 is connected to the first switching element P31 and driven by the first pre-decoded signal LAY345<i>.

The second driver 320 includes a second inverter unit P32 and N32 configured to drive the pre-column select signal YI_pre to output as the amplified column select signal YI_amp. The second inverter unit P32 and N32 may include a third switching element P32 and a fourth switching element N32. The third switching element P32 is connected to the power supply voltage terminal VDD and driven by the pre-column select signal YI_pre, and the fourth switching element N32 is connected to the third switching element P32 and driven by the pre-column select signal YI_pre.

The first current controller 330 may include a first transmission element T31 and a fifth switching element N33. The first transmission element T31 is driven by the bank active signal RACTB, and connected to an input terminal of the second driver 320, and the fifth switching element N33 is connected between the first transmission element T31 and the ground terminal VSS and driven by the bank active signal RACTB.

Specifically, the first transmission element T31 is connected between a gate terminal of the third switching element P32 and a gate terminal of the fourth switching element N32, and driven in response to the bank active signal RACTB.

The second current controller 340 includes a second transmission element T32 and a sixth switching element N34. The second transmission element T32 is driven by the bank active signal RACTB and configured to output the amplified column select signal YI_amp as the column select signal YI, and the sixth switching element N34 is driven by the bank active signal RACTB and connected between an output terminal of the column select signal YI and the ground terminal VSS.

When a specific bank is selected, the bank active signal RACTB is set to a low level, and the pre-column select signal YI_pre is set to a low level. Since the first transmission element T31 is turned on and the fourth switching element N32 is turned off, the high-level amplified column select signal YI_amp is generated. Since the second transmission element T32 is turned on and the sixth switching element N34 is turned off, the column select signal YI is stably outputted at a high level.

When a specific bank is not selected, the bank active signal RACTB is set to a high level, and the pre-column select signal YI_pre is set to a high level. In this case, since the first transmission element T31 is turned off, the high-level pre-column select signal YI_pre is not transmitted to the gate terminal of the fourth switching element N32. Since the fifth switching element N33 is turned on, the fourth switching element N32 is controlled to be turned off. Therefore, both of the third and fourth switching elements P32 and N32 forming the second driver 320 maintain an off state, thereby suppressing a leakage current in the off state.

As the second transmission gate T32 forming the second current controller 340 is turned off, the column select signal YI is outputted at a low level. Since the sixth switching element N34 is turned on, the level of the column select signal YI is further stabilized.

Since the column select signal YI must drive a very long metal line, the switching elements P32 and N32 forming the second driver 320 are designed to have a large size. Therefore, when the leakage current in an off state is not controlled, the entire current consumption increases and degrades the operation characteristic. In this embodiment of the present invention, however, when a specific bank is not selected, all of the switching elements P32 and N32 forming the second driver 320 may be controlled to be turned off, which makes it possible to reliably suppress a leakage current.

The sixth switching element N34 forming the second current controller 340 may be configured as a transistor having a very small size to induce only a minimum amount of current into the ground terminal. As a result, since the column select signal generation circuit 30 consumes only a minimum amount of current in an off state, it is possible to significantly reduce the entire current consumption of the memory apparatus.

Figure 1:
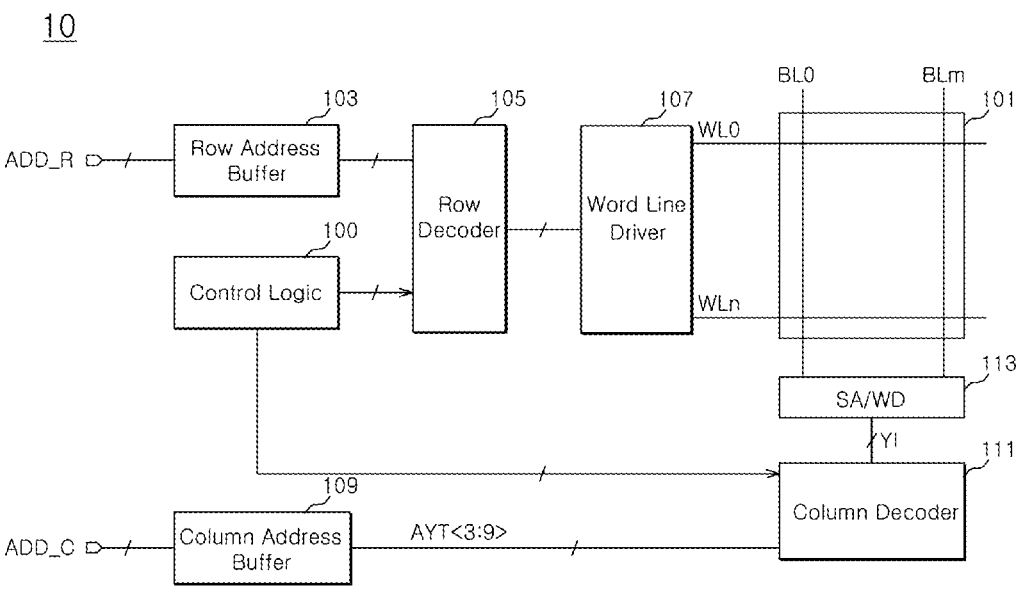
FIG. 1 is a configuration diagram of a conventional semiconductor memory apparatus.
Figure 2:
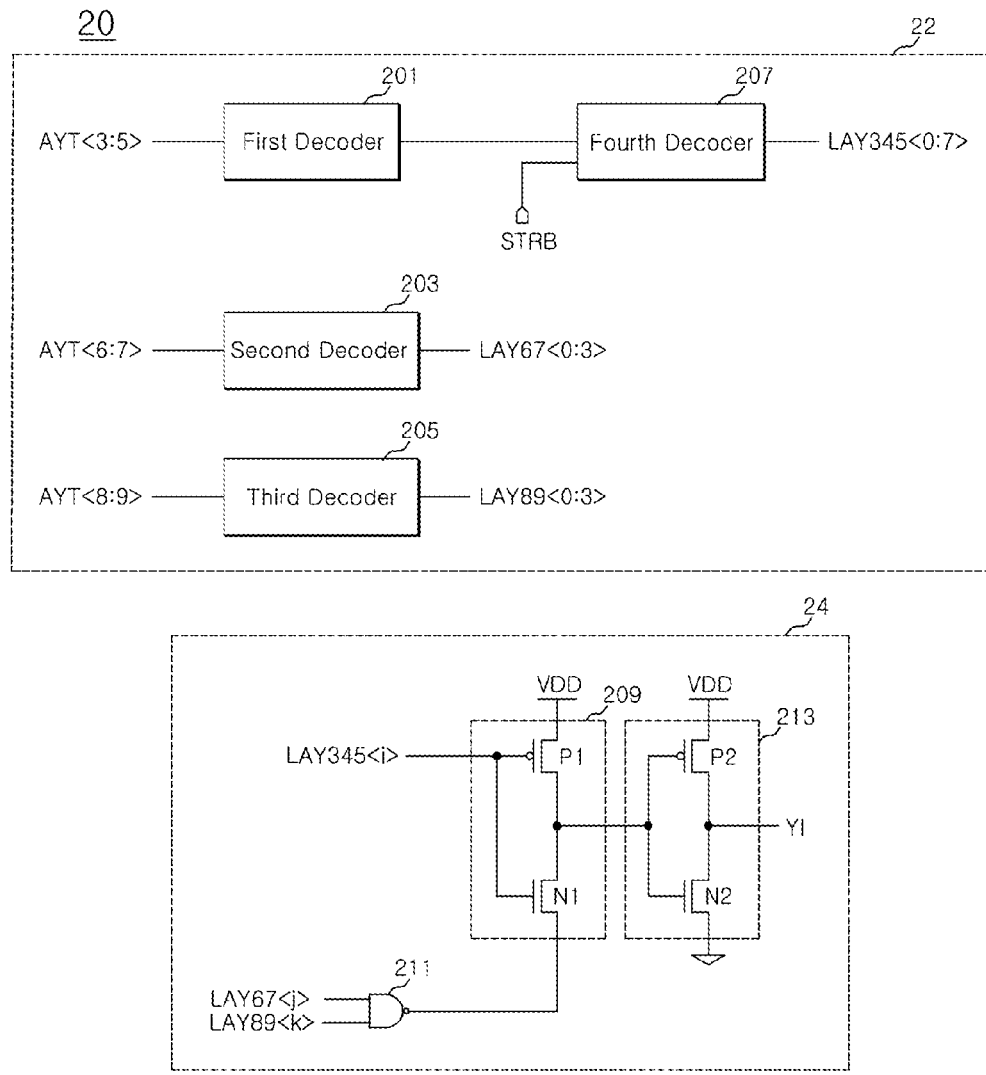
FIG. 2 is a configuration diagram of a conventional column decoder.

In the conventional column select signal generation circuit illustrated in FIG. 2, when the input signal of the second driver 213 is set to a high level (the corresponding bank is not selected), the transistor N2 forming the second driver 213 is turned on. Therefore, a considerable amount of leakage current flows through the transistor N2 having a large size.

In this embodiment of the present invention, however, when the corresponding bank is not selected and the input signal of the second driver 320 is set to a high level, the bank active signal RACTB set to a high level applies a low-level voltage to the gate terminal of the fourth switching element N32. Therefore, the fourth switching element N32 may be maintained in an off state, and is possible to block a leakage current through the second driver 320 having a very large size.

Since the sixth switching element N34 forming the second current controller 340 is designed to have a very small size, the column select signal YI may be generated at the output terminal by minimum current consumption.

While certain embodiments have been described above, it will be understood to those skilled in the art that the embodiments described are by way of example only. Accordingly, the column select signal generation circuit described herein should not be limited based on the described embodiments. Rather, the column select signal generation circuit described herein should only be limited in light of the claims that follow when taken in conjunction with the above description and accompanying drawings.

What is claimed is:

1. A column select signal generation circuit comprising:
a first current controller configured to control the level of a pre-column select signal in response to a bank active signal;
a driver configured to generate an amplified column select signal in response to the pre-column select signal; and
a second current controller configured to generate an output signal of the driver as a column select signal in response to the bank active signal,
wherein the driver comprises:
a first switching element connected to a power supply voltage terminal and driven by the pre-column select signal; and
a second switching element connected between the first switching element and a ground terminal, and
the first current controller is connected between a pre-column select signal supply terminal and the ground terminal, and controls the voltage level of a second switching element driving signal in response to the bank active signal,
and wherein the first current controller comprises:
a first transmission element connected between the pre-column select signal supply terminal and a gate terminal of the second switching element and driven in response to the bank active signal; and
a third switching element connected between the first transmission element and the ground terminal and driven in response to the bank active signal.

2. The column select signal generation circuit according to claim 1, wherein the second current controller comprises:
a second transmission element configured to generate the output signal of the driver as a column select signal in response to the bank active signal; and
a fourth switching element connected between a column select signal output terminal and the ground terminal and driven in response to the bank active signal.

3. The column select signal generation circuit according to claim 1, wherein the pre-column select signal is generated by decoding an external column address.

4. A column select signal generation circuit comprising:
a first driver configured to generate a pre-column select signal in response to a column address;
a second driver configured to drive the pre-column select signal and generate a column select signal;
a first current controller connected between the first and second drivers and configured to control a current of the second driver in response to a bank active signal; and
a second current controller connected to an output terminal of the second driver and configured to control a current of a column select signal output terminal in response to the bank active signal,
wherein the first current controller comprises:
a first transmission element connected between first and second input terminals of the second driver and driven in response to the bank active signal, the first input terminal receiving the pre-column select signal; and
a first switching element connected between the first transmission element and a ground terminal and driven in response to the bank active signal.

5. The column select signal generation circuit according to claim 4, wherein the second driver comprises:
a second switching element connected to a power supply voltage terminal and configured to receive the pre-column select signal through the first input terminal; and
a third switching element connected between the second switching element and the ground terminal and driven according to a voltage level applied to the second input terminal.

6. The column select signal generation circuit according to claim 4, wherein the second current controller comprises:
a second transmission element configured to output the column select signal in response to the bank active signal; and
a fourth switching element connected between the column select signal output terminal and a ground terminal and driven in response to the bank active signal.

7. The column select signal generation circuit according to claim 1, wherein the first current controller is connected to a pre-column select signal supply terminal, and the driver is connected to the pre-column select signal supply terminal.

8. The column select signal generation circuit according to claim 4, wherein the second driver is connected to a pre-column select signal supply terminal, and the first current controller is connected to the pre-column select signal supply terminal.

\* \* \* \* \*